US008102158B2

United States Patent
Sekine et al.

(10) Patent No.: US 8,102,158 B2
(45) Date of Patent: Jan. 24, 2012

(54) PHASE SYNCHRONIZATION CIRCUIT

(75) Inventors: Fusae Sekine, Oizumi-machi (JP); Naoyuki Ogino, Sano (JP)

(73) Assignees: Semiconductor Components Industries, LLC, Phoenix, AZ (US); Sanyo Semiconductor Co., Ltd., Gunma (JP)

( * ) Notice: Subject to any disclaimer, the term of this patent is extended or adjusted under 35 U.S.C. 154(b) by 505 days.

(21) Appl. No.: 12/411,321

(22) Filed: Mar. 25, 2009

(65) Prior Publication Data

US 2009/0243557 A1 Oct. 1, 2009

(30) Foreign Application Priority Data

Mar. 26, 2008 (JP) ................. 2008-081703

(51) Int. Cl.
*H02J 7/00* (2006.01)
*H03L 7/00* (2006.01)
(52) U.S. Cl. ........... 320/166; 320/167; 331/1 R; 331/18; 331/25
(58) Field of Classification Search .............. 320/166
See application file for complete search history.

(56) References Cited

U.S. PATENT DOCUMENTS

| 7,978,013 B2* | 7/2011 | Dosho et al. ............. 331/16 |
| 2004/0150443 A1* | 8/2004 | Muroor ................ 327/156 |
| 2009/0237036 A1* | 9/2009 | Ikeda et al. ............. 320/166 |

FOREIGN PATENT DOCUMENTS

| JP | 2002-111493 | 1/2002 |
| JP | 2002-368611 | 12/2002 |

* cited by examiner

*Primary Examiner* — Edward Tso
*Assistant Examiner* — Johali Torres Ruiz
(74) *Attorney, Agent, or Firm* — SoCal IP Law Group LLP; Steven C. Sereboff; John E. Gunther

(57) ABSTRACT

A phase synchronization circuit comprising: a charging/discharging-circuit to charge/discharge a capacitor in accordance with a drive-signal, charging and/or discharging current-values of the capacitor being settable; an oscillation-circuit to output an oscillation-signal having a frequency corresponding to a charging-voltage; a drive-circuit to output as the drive-signal a first drive-signal for matching charging and discharging periods when a phase-difference and the oscillation-signal is smaller than a predetermined phase-difference and reducing the phase-difference when the phase-difference is greater than the predetermined phase-difference; and a setting-circuit to receive setting-data for setting the charging and/or discharging current-values, hold the setting-data, and set the charging and/or discharging current-values, based on the setting-data, the drive-circuit outputting as the drive-signal a second drive-signal for matching charging and discharging periods, when receiving an adjustment-instruction-signal, the setting-circuit holding the setting-data for rendering at a constant level the charging-voltage of the capacitor charged/discharged in accordance with the second drive-signal.

6 Claims, 6 Drawing Sheets

FIG. 2

PHASE SYNCHRONIZATION CIRCUIT

CROSS-REFERENCE TO RELATED APPLICATION

This application claims the benefit of priority to Japanese Patent Application No. 2008-81703, filed Mar. 26, 2008, of which full contents are incorporated herein by reference.

BACKGROUND OF THE INVENTION

1. Field of the Invention

The present invention relates to a phase synchronization circuit.

2. Description of the Related Art

Recently, various electronic devices often use a phase synchronization circuit (hereinafter, PLL (Phase Locked Loop)) to generate output signal in synchronization with the phase of input signal. FIG. 5 depicts an example of an integrated PLL 300. A VCO (Voltage Controlled Oscillator) 400 outputs an output signal OUT having a frequency corresponding to a charging voltage of a capacitor C. If the phase of the output signal OUT is delayed from the phase of the input signal IN, a phase comparison circuit 410 outputs a high-level (hereinafter, H-level) pulse signal QA for a period corresponding to a phase difference. If the phase of the output signal OUT is advanced from the phase of the input signal IN, the phase comparison circuit 410 outputs an H-level pulse signal QB for a period corresponding to a phase difference. A charge pump 420 is a circuit that charges/discharges the capacitor C depending on the pulse signals QA, QB and if the H-level pulse signal QA is input to the charge pump 420, a switch SW1 is turned on and the capacitor C connected through a terminal 430 is charged with a bias current of a current source I1. On the other hand, the H-level pulse signal QB is input to the charge pump 420, a switch SW2 is turned on and the capacitor C is discharged with a bias current of a current source I2. A resistor R makes up a low-pass filter with the capacitor C to attenuate the high-frequency component of the charging/discharging current of the charge pump 420 and compensate the phase of the feedback loop in the PLL 300. The bias current value of the current source I1 is determined based on a set value of a bias current adjustment circuit 440 and the frequency of the output signal OUT of the VCO 400 is increased as the charging voltage of the capacitor C is increased. Therefore, the PLL 300 having the configuration of FIG. 5 operates such that the phase of the output signal OUT conforms to the phase of the input signal IN.

The state of the output signal OUT and the input signal IN having the matched phase, i.e., the locked state of the PLL 300 will be described. Since the charging voltage of the capacitor C does not need to be changed when the PLL 300 is locked, the phase comparison circuit 410 may set the outputs of the pulse signals QA, QB to low. However, when the outputs of the pulse signals QA, QB are set to low, if the charging voltage of the capacitor C is reduced due to, for example, a leak current of the capacitor C and a slight phase difference is generated, the high-level pulse signal QA corresponding to the slight phase difference may not turn on the switch SW1 because of a parasitic capacitance, etc., of the switch SW1, resulting in a problem that the PLL 300 does not operate. Therefore, as exemplarily illustrated in FIG. 6, the phase comparison circuit 410 is driven to output the high-level pulse signals QA, QB such that the respective switches SW1, SW2 are turned on for the same periods so as not to change the charging voltage of the capacitor C if the PLL 300 is locked (see, e.g., Japanese Patent Application Laid-Open Publication No. 2002-111493 or 2002-368611).

Even when the PLL 300 is locked and the respective switches SW1, SW2 are turned on for the same periods by the high-level pulse signals QA, QB output from the phase comparison circuit 410, if respective bias current values of the current sources I1, I2 charging/discharging the capacitor C are different, the charging voltage of the capacitor C cannot be kept constant and, as a result, the PLL 300 cannot be kept locked. Even if the current sources I1, I2 are designed such that the respective bias current values are made identical, it is difficult to make the both bias current values identical because of production variations. Therefore, an arbitrary number of PLLs may be extracted as samples from, for example, a plurality of PLLs included in a wafer, and the bias current adjustment circuit 440 may be set such that the bias current value of the current source I1 becomes identical to the bias current value of the current source I2 in other PLLs included in the wafer based on the bias current values of the current sources I1, I2 of the extracted PLLs for typical integrated PLLs.

If the charging/discharging current values of the charge pumps in other PLLs included in the wafer are set in advance based on the current values of the charging/discharging currents of the charge pumps in the PLLs extracted as the sample from the wafer as described above, predicted charging/discharging current values are set for charge pumps of PLLs no extracted as the samples and, therefore, it is problematically difficult to accurately match the current values of the charging current and the discharging current.

SUMMARY OF THE INVENTION

A phase synchronization circuit according to an aspect of the present invention, comprises: a charging/discharging circuit configured to charge/discharge a capacitor in accordance with a drive signal giving an instruction to charge/discharge the capacitor, a current value of at least one of a charging current and a discharging current of the capacitor being settable; an oscillation circuit configured to output an oscillation signal having a frequency corresponding to a charging voltage of the capacitor; a drive circuit configured to output a first drive signal as the drive signal, the first drive signal being a signal for matching a charging period and a discharging period of the capacitor when a phase difference between an input signal as a reference of the oscillation signal and the oscillation signal is smaller than a predetermined phase difference and for reducing the phase difference when the phase difference is greater than the predetermined phase difference; and a setting circuit configured to receive setting data for setting the current value of at least one of the charging current and the discharging current of the charging/discharging circuit, hold the setting data, and set the current value of at least one of the charging current and the discharging current of the charging/discharging circuit based on the setting data, the drive circuit outputting as the drive signal a second drive signal for matching a charging period and a discharging period of the capacitor, when receiving an adjustment instruction signal giving an instruction to adjust a current value mismatch between the charging current and the discharging current of the charging/discharging circuit, the setting circuit holding the setting data for rendering at a constant level the charging voltage of the capacitor charged/discharged in accordance with the second drive signal.

Other features of the present invention will become apparent from descriptions of this specification and of the accompanying drawings.

BRIEF DESCRIPTION OF THE DRAWINGS

For more thorough understanding of the present invention and advantages thereof, the following description should be read in conjunction with the accompanying drawings, in which.

DETAILED DESCRIPTION OF THE INVENTION

At least the following details will become apparent from descriptions of this specification and of the accompanying drawings.

Figure 1:
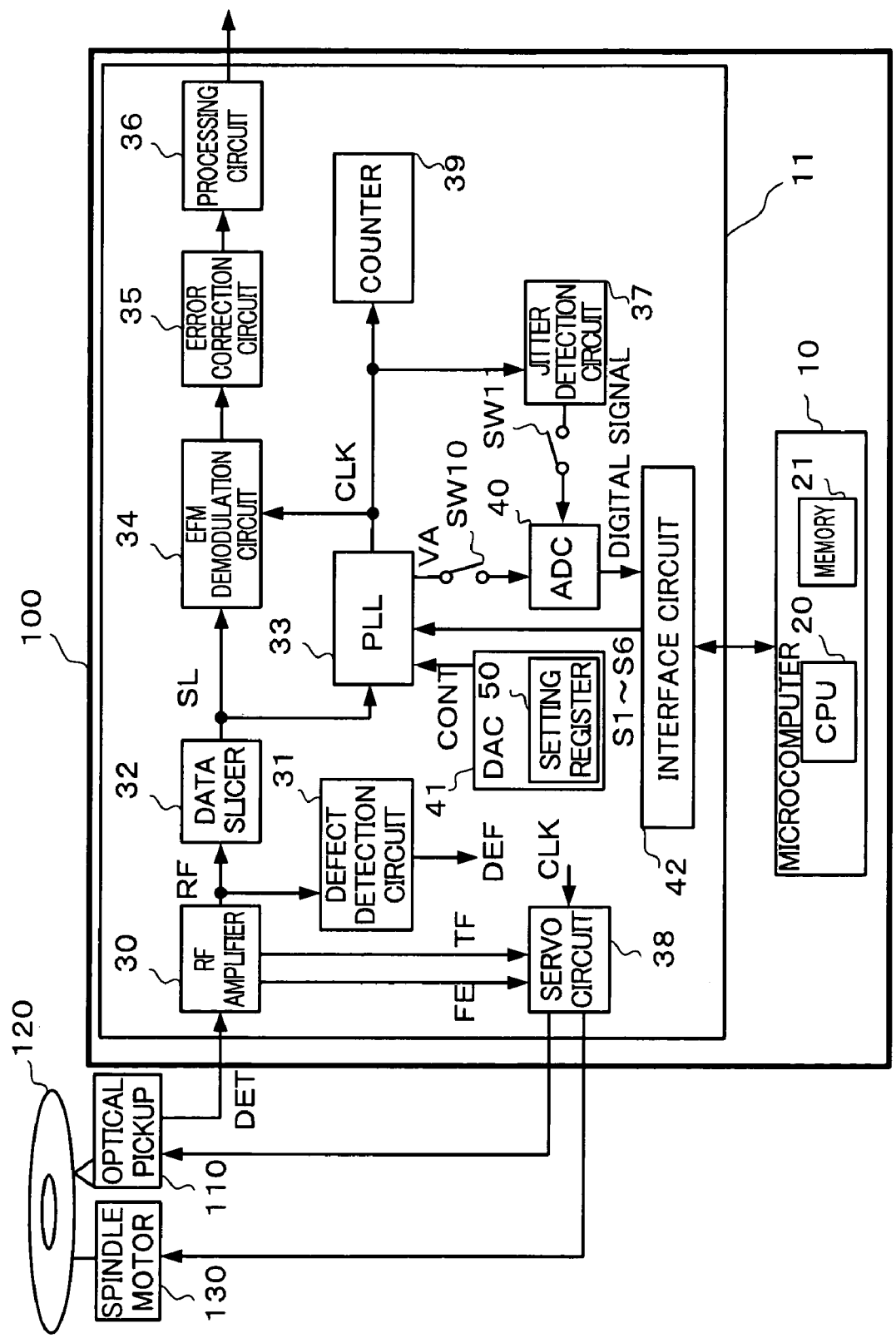
FIG. 1 is a diagram of an optical disc apparatus control circuit 100 that is an embodiment of the present invention.

FIG. 1 depicts an optical disc apparatus control circuit 100 that is an embodiment of the present invention.

The optical disc apparatus control circuit 100 includes a microcomputer 10 (current control circuit) and an optical-disc LSI (Large Scale Integration) 11. It is assumed that each of the microcomputer 10 and the optical-disc LSI 11 in this embodiment is an integrated circuit and that an optical disc 120 records music data, for example. Although the microcomputer 10 and the optical-disc LSI 11 are different integrated circuits in this embodiment, the microcomputer 10 and the optical-disc LSI 11 may form one integrated circuit.

The microcomputer 10 is a circuit that controls the optical-disc LSI 11 and includes a CPU 20 (current setting circuit) and a memory 21 (holding circuit). The CPU 20 is a processor that generally controls the microcomputer 10. The CPU 20 transmits various data to and receives various data from the optical-disc LSI 11, for example, and executes calculation processes of data stored in the memory 21. The memory 21 is a writable memory circuit such as RAM (Random Access Memory) and stores the calculation results of the CPU 20 and various data from the optical-disc LSI 11.

The optical-disc LSI 11 is a circuit that controls a spindle motor 130 that rotates the optical disc 120 and various motors (not shown) disposed on an optical pickup 110 to reproduce record data recorded on the optical disc 120 and includes an RF amplifier 30, a defect detection circuit 31 (detection circuit), a data slicer 32, a PLL (Phase Locked Loop) 33, an EFM (Eight to Fourteen Modulation) demodulation circuit 34 (synchronization signal output circuit), an error correction circuit 35 (error detection circuit), a processing circuit 36, a jitter detection circuit 37, a servo circuit 38, a counter 39, an ADC (Analog to Digital Converter) 40, a DAC (Digital to Analog Converter) 41 (setting circuit), an interface circuit 42, and switches SW10, SW11.

Schematic of the circuits making up the optical-disc LSI 11 will first be described.

The RF amplifier 30 receives a detection signal DET (output signal) indicative of the record data recorded on the optical disc 120 from the optical pickup 110 to generate an RF (Radio Frequency) signal obtained by amplifying the level of the detection signal DET, a focus error signal FE indicative of a focusing error, and a tracking error signal TE indicative of a tracking error.

Figure 2:
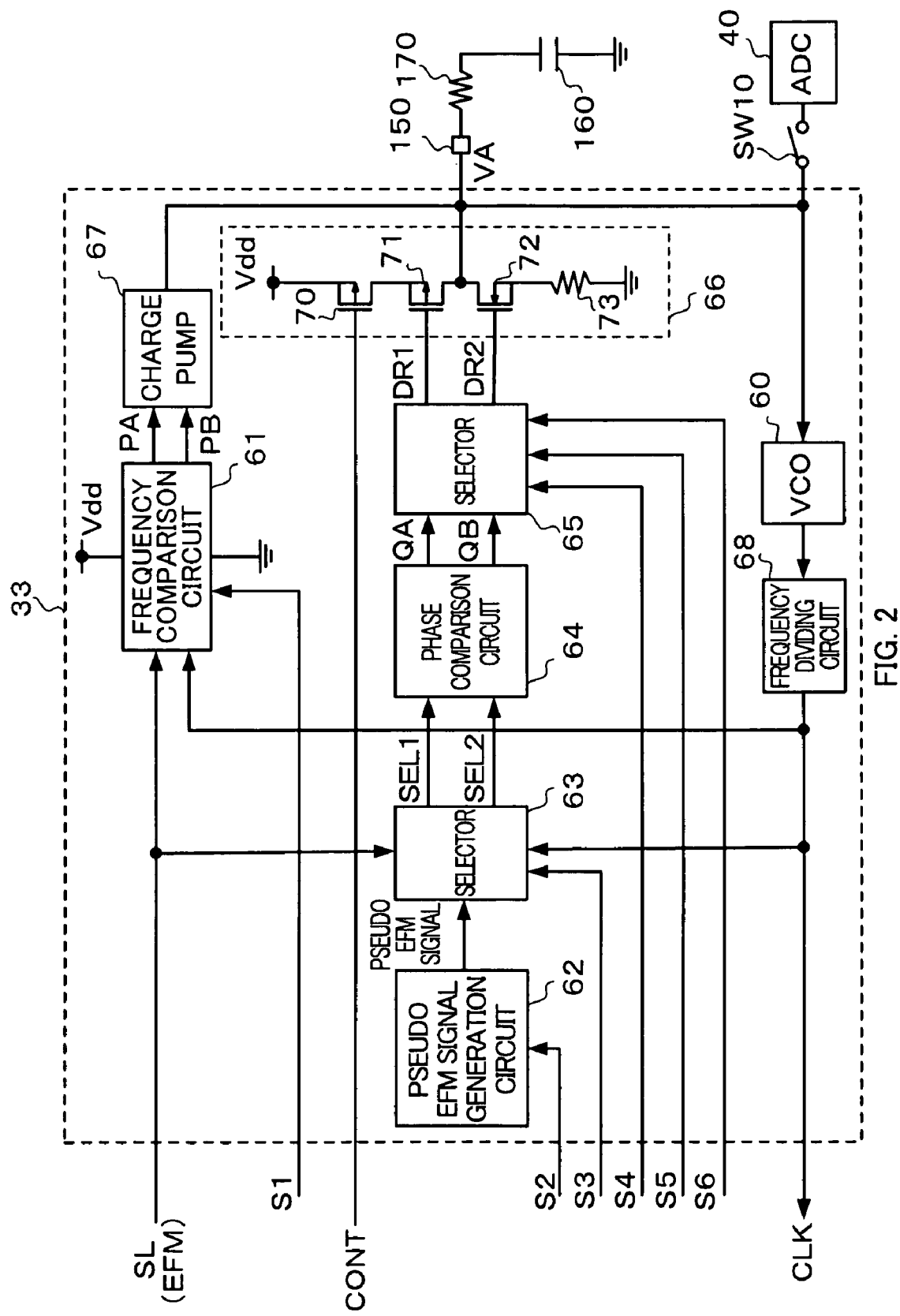
FIG. 2 is a diagram of an exemplary configuration of a PLL 33.

The defect detection circuit 31 is a circuit that outputs a defect signal DEF (detection signal) indicative of the presence of scratches, contaminations, etc., on the recording surface of the optical disc 120 based on the level of the RF signal from the RF amplifier 30. Specifically, if the recording surface of the optical disc 120 has scratches, etc., the level of the detection signal DET output from the optical pickup 110 is lowered and, therefore, the level of the RF signal is accordingly reduced. On the other hand, if the recording surface of the optical disc 120 does not have scratches, etc., the level of the detection signal DET output from the optical pickup 110 is heightened and, therefore, the level of the RF signal is accordingly increased. Therefore, the presence of scratches, etc., on the recording surface of the optical disc 120 may be detected by comparing a certain level of a threshold value Vt and the level of the RF signal in the defect detection circuit 31. If the recording surface of the optical disc 120 has scratches, etc., the high-level (hereinafter, H-level) defect signal DEF is output and if the recording surface of the optical disc 120 does not have scratches, etc., the low-level (hereinafter, L-level) defect signal DEF is output in this embodiment. The defect detection circuit 31 may be made up of a circuit as shown in FIG. 2 of Japanese Patent Application Laid-Open Publication No. 2007-250046, for example.

The data slicer 32 binarizes the RF signal output from the RF amplifier 30 and outputs the binarized RF signal as an output signal SL.

The PLL 33 is a circuit that generates a clock signal CLK synchronized with the output signal SL from the data slicer 32 based on a control signal CONT from the DAC 41 and control signals S1 to S6 from the interface circuit 42 described later.

The EFM demodulation circuit 34 performs the EFM demodulation of the output signal SL subjected to the EFM modulation in synchronization with the clock signal CLK from the PLL 33 to generate frames. The frames of the embodiment are assumed to include synchronization signals for establishing in advance the frame synchronization and the EFM demodulation circuit 34 outputs a frame synchronization signal (synchronization signal) each time the synchronization signal is detected.

The error correction circuit 35 is a circuit that performs error correction based on error-correcting codes included in the frames output from the EFM demodulation circuit 34. It is assumed in this embodiment that the frames preliminarily include error-correcting codes C1, C2 based on CIRC (Cross Interleaved Read-Solomon Code), for example. The error correction circuit 35 of this embodiment outputs an error detection signal indicative of the detection of a C1 error or C2 error, an error correction signal indicative of the possibility of the error correction based on CIRC, and an output signal subjected to the error correction based on CIRC. The error correction circuit 35 of this embodiment may be implemented with the error correction circuit described in Japanese Patent Application Laid-Open Publication No. 10-150368, for example.

The processing circuit 36 is a circuit that generates an audio signal based on the output signal subjected to the error correction by the error correction circuit 35 to output the signal to a power amplifier (not shown).

The jitter detection circuit 37 is a circuit for detecting jitter of the clock signal CLK output from the PLL 33. The detection result of the jitter detection circuit 37 of this embodiment is input through the switch SW11 to the ADC 40 only during the reproduction of the optical disc 120.

The servo circuit 38 controls the spindle motor 130 such that the optical disc 120 rotates at a constant linear velocity based on the clock signal CLK from the PLL 33 and the output from a crystal oscillation circuit (not shown) that oscillates at a frequency serving as the reference frequency of the optical-disc LSI 11 and controls various motors (not shown) disposed on the optical pickup 110 such that a laser beam of the optical pickup 110 follows the track of the optical disc 120 based on the focus error signal indicative of a focusing error and the tracking error signal indicative of a tracking error from the RF amplifier 30 and the detection result from the jitter detection circuit 37.

The counter 39 is a circuit that changes a count value in synchronization with the clock signal CLK from the PLL 33. Since the servo circuit 38 of this embodiment controls the linear velocity of the rotation of the optical disc 120 to be constant, data are output from the optical pickup 110 at a certain data rate. Therefore, the frequency of the clock signal CLK output from the PLL 33 is a predetermined frequency at the time of reproduction. When the frequency of the clock signal CLK is a predetermined frequency, the count value of the counter 39 changing in a predetermined period is a predetermined count value. The CPU 20 may acquire information about changes in the frequency of the clock signal CLK from the PLL 33 by comparing the count value of the counter 39 changing in a predetermined period with the predetermined count value. The counter 39 of this embodiment is an up-counter and the count value is reset in each predetermined period.

The ADC 40 is a circuit that converts input analog signals into digital signals. When only the switch SW10 is turned on between the switches SW10 and SW11 controlled through the interface circuit 42 by the CPU 20, a charging voltage of a capacitor charged/discharged by a charge pump of the PLL 33 described later is input and, when only the switch SW11 is turned on, the output of the jitter detection circuit 37 is input in this embodiment. As described in detail later, the ADC 40 of this embodiment is connected to the PLL 33 through the switch SW10 before the reproduction of the optical disc 120 and is connected to the jitter detection circuit 37 through the switch SW11 during the reproduction of the optical disc 120. Since the charging voltage of the capacitor charged/discharged by the charge pump of the PLL 33 are not converted into digital signals at the same time with the output of the jitter detection circuit 37 as above, a new ADC is not necessary to be provided. Therefore, the increase in the chip area may be reduced since only the switches SW10 and SW11 may be provided.

The DAC 41 is a circuit that sets the charging current of the charge pump of the PLL 33 described later based on a set value (set data) held in the setting register 50 that is a writable register disposed inside and outputs a control signal CONT for controlling the charging current of the charge pump of the PLL 33.

The interface circuit 42 is a circuit that transmits various data to and receives various data from the microcomputer 10. Specifically, in this embodiment, the interface circuit 42 receives the defect signal DEF from the defect detection circuit 31, the frame synchronization signal from the EFM demodulation circuit 34, the error detection signal and the error correction signal from the error correction circuit 35, the count value from the counter 39, and the digital data from the ADC 40, and transmits the received signals, the received value, and the received data to the CPU 20. The interface circuit 42 receives data for controlling the PLL 33 and data for controlling the switches SW10, SW11 from the CPU 20.

FIG. 2 depicts an exemplary configuration of the PLL 33. The PLL 33 includes a VCO (Voltage Controlled Oscillator) 60, a frequency comparison circuit 61, a pseudo EFM signal generation circuit 62, selectors 63, 65, a phase comparison circuit 64, a charge pump 66 (charging/discharging circuit), a charge pump 67, and a frequency dividing circuit 68. The pseudo EFM signal generation circuit 62, the selectors 63, 65, and the phase comparison circuit 64 correspond to a drive circuit. The VCO 60 and the frequency dividing circuit 68 correspond to an oscillation circuit.

The VCO 60 is a circuit that outputs a clock signal having a frequency corresponding to a charging voltage of a capacitor 160 externally connected through a voltage VA of a terminal 150. In this embodiment, the charging voltage of the capacitor 160 is the voltage VA and the frequency of the clock signal of the VCO 60 is increased as the charging voltage VA of the capacitor 160 is increased. In this embodiment, an oscillation signal output from the VCO 60 is input to the frequency dividing circuit 68. The frequency dividing circuit 68 divides the frequency of the input oscillation signal into 1/N (N: arbitrary set value) to output a clock signal CLK (oscillation signal).

The frequency comparison circuit 61 compares the frequencies of the output signal SL and the clock signal CLK based on the control signal S1 to output pulse signals PA, PB corresponding to a frequency difference. Specifically, when the control signal S1 is high, if the frequency of the output signal SL is lower than the frequency of the clock signal CLK, the L-level pulse signal PA is output for a period corresponding to a frequency difference and if the frequency of the output signal SL is higher than the frequency of the clock signal CLK, the H-level pulse signal PB is output for a period corresponding to a frequency difference. The frequency comparison circuit 61 outputs the H-level pulse signal PA and the L-level pulse signal PB if the control signal S1 is low.

The pseudo EFM signal generation circuit 62 is a circuit that outputs a pseudo EFM signal when the control signal S2 from the interface circuit 42 is high, for example, and that stops the output of the pseudo EFM signal when the control signal S2 is low, for example. The pseudo EFM signal generation circuit 62 of this embodiment stores EFM-modulated signals into a table, etc., (not shown) in advance and if the H-level control signal S2 is input, the stored signal is output as the pseudo EFM signal. For example, the pseudo EFM signal may be generated with the pseudo EFM signal generation circuits described in Japanese Patent Application Laid-Open Publication Nos. 2001-202626 and 2005-353234.

The selector 63 is a circuit that selects the input pseudo EFM signal, the output signal SL, and the clock signal CLK, and outputs the selected signals to the phase comparison circuit 64 as output signals SEL1, SEL2, based on the control signal S3 from the interface circuit 42. Specifically, for example, in the case of the H-level control signal S3, the output signal SL and the clock signal CLK are output as the output signals SEL1 and SEL2. For example, in the case of the L-level control signal S3, the pseudo EFM signal is output as the output signals SEL1 and SEL2. The L-level control signal S3 corresponds to an adjustment instruction signal.

The phase comparison circuit 64 is a circuit that outputs the pulse signals QA, QB corresponding to a phase difference between the output signal SEL1 and the output signal SEL2 from the selector 63. Specifically, if the phase of the output signal SEL2 is delayed from the phase of the output signal SEL1, the L-level pulse signal QA is output for a period corresponding to a phase difference and if the phase of the output signal SEL2 is advanced from the phase of the output signal SEL1, the H-level pulse signal QB is output for a period corresponding to a phase difference. If the phases of the output signals SEL1 and SEL2 are identical, the phase comparison circuit 64 of this embodiment outputs the L-level pulse signal QA and the H-level pulse signal QB for a period equivalent to the period of turning on a PMOS transistor 71 and an NMOS transistor 72 of the charge pump 66 described later. When the phases of the output signals SEL1 and SEL2 are identical, the period of the output pulse signals QA and QB is assumed to be a predetermined sufficiently short period among periods necessary for turning on the PMOS transistor 71 and the NMOS transistor 72. If the phases of the signals input to the phase comparison circuit 64 are synchronized with each other, this is hereinafter referred as the locked state of the PLL 33.

For example, if the control signal S4 from the interface circuit 42 is high, the selector 65 outputs the pulse signals QA and QB from the phase comparison circuit 64 to the charge pump 66 as drive signals DR1 and DR2, respectively. For example, if the control signal S4 is low, the selector 65 outputs the drive signals DR1 and DR2 set to levels based on the levels of the control signals S5 and S6. Specifically describing the case of the L-level control signal S4, the drive signal DR1 is set to the reversed level of the level of the control signal S5, and the drive signal DR2 is set to the same level as the control signal S6. In this embodiment, for example, if the control signal S4 is high and the control signal S5 is high, this state is hereinafter be described as the control signals (S4, S5)=(H, H). The drive signals DR1, DR2 output from the selector 65 in the case of the control signals (S3, S4)=(H, H) correspond to a first drive signal, and the drive signals DR1, DR2 output from the selector 65 in the case of the control signals (S3, S4)=(L, H) correspond to a second drive signal in this embodiment.

The charge pump 66 is a circuit that charges/discharges the capacitor 160 connected through the terminal 150 based on the drive signals DR1 and DR2 output from the selector 65 and includes PMOS transistors 70, 71, the NMOS transistor 72, and resistor 73. The resistance value of the resistor 73 is R1 and the on-resistances of the PMOS transistor 71 and the NMOS transistor 72 are sufficiently smaller than the resistance value R1 in this embodiment. Since the control signal CONT from the DAC 41 is input to the gate electrode of the PMOS transistor 70 in this embodiment, the on-resistance of the PMOS transistor 70 is controlled by the level of the control signal CONT from the DAC 41. Therefore, when the drive signal DR1 turning on the PMOS transistor 71 is input, the charge pump 66 charges the capacitor 160 with a current having a current value corresponding to the level of the control signal CONT from the DAC 41. When the drive signal DR2 turning on the NMOS transistor 72 is input, the charge pump 66 discharges the capacitor 160 with a current having a current value corresponding to the resistance value R1 of the resistor 73.

The charge pump 67 is a circuit charging the capacitor 160 during the period of the L-level pulse signal PA and discharging the capacitor 160 during the period of the H-level pulse signal PA. The charge pump 67 of this embodiment is assumed to be a circuit having the output turning to high-impedance when the H-level pulse signal PA and the L-level pulse signal PB are input. Therefore, in the case of the H-level control signal S1, the charge pump 67 of this embodiment is driven depending on the pulse signals PA and PB output from the frequency comparison circuit 61 to charge/discharge the capacitor 160. On the other hand, in the case of the L-level control signal S1, since the H-level pulse signal PA and the L-level pulse signal PB are input to the charge pump 67 of this embodiment, the output turns to high impedance and the output of the charge pump 67 is electrically detached from the terminal 150.

The resistor 170 makes up a low-pass filter with the capacitor 160 to attenuate the high-frequency component of the charging/discharging current output from the charge pump 66. The low-pass filter compensates the phase of the feedback loop in the PLL 33.

Description will be made of adjustment of the charging current in the PLL 33 performed before starting the reproduction of music recorded on the optical disc 120, i.e., a process of matching the current values of the charging current and the discharging current of the PLL 33 with reference to a flow-chart shown in FIG. 3. In this embodiment, the initial state is assumed to be established when the switch SW10 of the optical-disc LSI 11 is turned on; the switch SW11 is turned off; the level of the control signal CONT from the DAC 41 is set to, for example, Vdd/2, which is a half of the power supply voltage Vdd of the optical-disc LSI 11; the charging/discharging current of the frequency comparison circuit 61 is stopped; the PMOS transistor 71 of the charge pump 66 is turned off; and the NMOS transistor 72 is turned on.

When the microcomputer 10 and the optical-disc LSI 11 are activated, the CPU 20 transmits data for turning on the switch SW10 and turning off the switch SW11, data for setting the setting register 50 such that the level of the control signal CONT from the DAC 41 turns to Vdd/2, and the controls signals (S1, S4, S5, S6)=(L, L, L, H) through the interface circuit 42 to put the optical-disc LSI 11 into the initial state (S200). The CPU 20 transmits the control signals (S5, S6)=(H, L) and then transmits the L-level control signal S5 to charge the capacitor 160 only for a predetermined period (S201). In this embodiment, the predetermined period from the start of the charging to the stoppage of the charging is defined such that the charging voltage VA of about Vdd/2 is achieved if sufficiently long time elapses after the charging of the capacitor 160 is stopped. The above predetermined period may be determined with reference to a time constant based on the capacitance value of the capacitor 160, the resistance value of the PMOS transistor 70, and the resistance value of the resistor 170. The CPU 20 receives data indicative of a value of the charging voltage VA of the capacitor 160 output from the ADC 40 at predetermined intervals through the interface circuit 42 and stores the data into the memory 21. For example, if each of differences between the latest data indicative of the latest value of the charging voltage VA and the data received at the past two times from the latest data is within, for example, 5% based on the value of the charging voltage VA stored in the memory 21 (S202: YES), the CPU 20 stores the latest data into the memory 21 as a reference voltage Vref (S203). On the other hand, if each of differences between the latest data and the data received at the past two times is not within 5% (S202: NO), the process of comparing the received data and the latest data is continued (S202).

After the process of S203 is executed, the CPU 20 transmits the control signals (S2, S3, S4)=(H, L, H) through the interface circuit 42 to drive the charge pump 66 based on the output from the pseudo EFM signal generation circuit 62 (S204). When the interface circuit 42 receives the control signals (S2, S3, S4)=(H, L, H), both the output signals SEL1 and SEL2 of the selector 63 turn to the pseudo EFM signals. Since the phases are synchronized when both the output signals SEL1 and SEL2 turn to the pseudo EFM signals, the phase comparison circuit 64 outputs the drive signals DR1 and DR2 of the locked state of the PLL 33. Therefore, the charging voltage VA is changed based on degrees of the current values of the charging current and the discharging current of the charge pump 66 in the locked state of the PLL 33. Specifically, if the charging current is greater than the discharging current, the charging voltage VA is increased, and if the charging current is smaller than the discharging current, the charging voltage VA is reduced. Only when the current values of the charging current and the discharging current are matched, the charging voltage VA is constant. When the phase comparison circuit 64 outputs the above drive signals DR1 and DR2, if the charging voltage VA of the capacitor 160 is identical to the reference voltage Vref (S205: YES), the current values of the charging current and the discharging current from the charge pump 66 are matched as described above and, therefore, the current value is not necessary to be changed and the CPU 20 holds the set value set in the setting register 50 without update (S206) to terminate the process. On the other hand, when the phase comparison circuit 64 outputs the above drive signals DR1 and DR2, if the charging voltage VA of the capacitor 160 is not identical to the reference voltage Vref (S205: NO), the CPU 20 calculates a difference between the charging voltage VA and the reference voltage Vref and executes a calculation process for the calculated difference with the use of a predetermined calculation equation for proportional control to reduce the difference (S207). The set value of the setting register 50 is changed based on the calculation result (S208). A transition is then made to the process of comparing the charging voltage VA and the reference voltage Vref (S205). Since the microcomputer 10 executes the above process for the optical-disc LSI 11, the current values may be matched between the charging current and the discharging current of the charge pump 66 in the PLL 33.

As above, even when the charging current of the PLL 33 is adjusted before the reproduction of music, if a change in ambient temperature, variation of the power supply voltage, etc., occur during the reproduction, the current values of the charging current and the discharging current of the PLL 33 are varied, and it may be difficult to maintain the locked state of the PLL 33 if the PLL 33 is operated with the set value before the reproduction. Therefore, when the music recorded on the optical disc 120 is reproduced, the optical disc apparatus control circuit 100 of the embodiment executes a process of matching the current values of the charging current and the discharging current of the charge pump 66. The process of matching the current values of the charging current and the discharging current of the charge pump 66 at the time of reproduction of the optical disc 120 will hereinafter be described with reference to FIG. 4. It is assumed in this embodiment that the set value is held in the setting register 50 to match the current values of the charging current and the discharging current of the charge pump 66 in advance through the process described in FIG. 3.

When an instruction signal for instructing the CPU 20 to start reproduction of music is input, for example, from an external interface (not shown), the CPU 20 transmits the control signals (S1, S2, S3, S4)=(H, L, H, H) and the data for turning off the switch SW10 and turning on the switch SW11 through the interface circuit 42 to start the reading of the record data recorded on the optical disc 120 (S301). When the interface circuit 42 receives the above control signals, the frequency comparison circuit 61 is operated and the selector 63 outputs the output signal SL and the clock signal CLK as the output signals SEL1 and SEL2, respectively, and the selector 65 outputs the output from the phase comparison circuit 64 as the drive signals DR1 and DR2. The PLL 33 operates to synchronize the phase of the clock signal CLK from the frequency dividing circuit 68 with the output SL from the data slicer 32. After the PLL 33 synchronizes the phase of the clock signal CLK with the output signal SL, when the EFM demodulation circuit 34 outputs the frame synchronization signal indicative of the possibility of the reproduction of music (S302: YES), the CPU 20 executes a process based on the level of the defect signal DEF from the defect detection circuit 31 (S303). On the other hand, if the frame synchronization signal is not output from the EFM demodulation circuit 34 (S302: NO), the CPU 20 repeats the process of S302 until the frame synchronization signal is output.

The case of outputting the L-level defect signal DEF from the defect detection circuit 31 during the reproduction (S303: L) will be described. If the error correction circuit 35 does not output the error detection signal indicative of the detection of the C1 error or C2 error during the reproduction (S304: NO), the optical disc apparatus control circuit 100 continues the reproduction of music (S303). On the other hand, if the error correction circuit 35 outputs the error detection signal indicative of the detection of the C1 error or C2 error (S304: YES), the CPU 20 compares the count value of the counter 39 changed in a predetermined period with a predetermined count value and executes a process based on the comparison result (S305). If the count value of the counter 39 changed in the predetermined period is equivalent to the predetermined count value (S305: YES), i.e., if the frequency of the clock signal CLK is a predetermined frequency, the optical disc apparatus control circuit 100 continues the reproduction of music (S303). If the count value of the counter 39 changed in the predetermined period is not equivalent to the predetermined count value (S305: NO), for example, if the count value of the counter 39 changed in the predetermined period is not equivalent to the predetermined count value (S305: NO), for example, if the count value of the counter 39 changed in the predetermined period is greater than the predetermined count value, the frequency of the clock signal is higher than the predetermined frequency and, therefore, the set value of the setting register 50 is changed to increase the level of the control signal CONT from the DAC 41 (S306). On the other hand, if the count value of the counter 39 changed in the predetermined period is smaller than the predetermined count value, the frequency of the clock signal is lower than the predetermined frequency and, therefore, the set value of the setting register 50 is changed to reduce the level of the control signal CONT from the DAC 41 (S306). For example, if the set value of the setting register 50 is changed to increase the level of the control signal CONT from the DAC 41 in the above process of S306, the on-resistance of the PMOS transistor 70 of the charge pump 66 is increased. Therefore, since the charging current is reduced and the charging voltage VA is reduced, the frequency of the clock signal CLK is reduced that is the oscillation frequency of the VCO 60. After the process of S306 is executed, if the frame synchronization signal is output (S307: YES), the optical disc apparatus control circuit 100 continues the reproduction of music (S303). On the other hand, if the frame synchronization signal is not output (S307: NO), the CPU 20 repeats the process from S304 until the frame synchronization signal is output.

Description will then be made of the case that the H-level defect signal DEF is output from the defect detection circuit 31 during the reproduction (S303: H), i.e., the case that the level of the detection signal DET from the optical pickup 110 is reduced due to scratches, etc., on the surface of the optical disc 120 during the reproduction, causing the PLL 33 to be unlocked. If the defect detection circuit 31 outputs the H-level defect signal DEF (S303: H), the CPU 20 transmits the control signals (S1, S4, S5, S6)=(L, L, L, L) through the through the interface circuit 42 to stop the charging/discharging operation of the charge pump 66 (S308). When receiving the control signal, the interface circuit 42 stops the frequency comparison circuit and causes the selector 65 to output the H-level drive signal DR1 and the L-level drive signal DR2. Since the outputs of the charge pumps 66 and 67 are turned to high impedance by the process of S308, the charging voltage VA is held. Therefore, the PLL 33 operates in accordance with the oscillation frequency corresponding to the charging voltage VA. The CPU 20 stores the current set value of the setting register 50 into the memory 21 as a first set value. The CPU 20 calculates the set value reducing the level of the control signal CONT based on the level of the control signal when the first set value is set in the setting register 50 and stores the set value into the memory 21 as a second set value (S309). The second set value of the embodiment is calculated by the CPU 20 multiplying the first set value by a predetermined rate, for example. If the L-level defect signal DEF is output from the defect detection circuit 31, i.e., the laser beam of the optical pickup 110 passes the scratches, etc., on the surface of the optical disc 120 (S310: YES), the CPU 20 sets the second set value in the setting register 50 and transmits the control signals (S1, S4)=(H, H) and the second set value to the interface circuit 42 to resume the operation of the charge pump 66 (S311). Therefore, when the interface circuit 42 receives the above control signals and the second set value, the operation of the PLL 33 is resumed with the charging current of the charge pump 66 increased greater than the discharging current. When the PLL 33 is locked and the frame synchronization signal is output (S312: YES), the CPU 20 transmits the first set value to the interface circuit 42 to set the first set value in the setting register 50 (S313). After the process of S313 is executed, the optical disc apparatus control circuit 100 continues the reproduction of music (S303).

When activating the optical disc apparatus control circuit 100 of this embodiment with the configuration described above, the set value is set in the setting register 50 to match the current values of the charging current and the discharging current of the charge pump 66 before starting the reproduction of the optical disc 120 (S200 to S208). Therefore, the charging current and the discharging current of the charge pump may accurately be matched as compared to the case of setting in advance the charging/discharging current values of the charge pumps in other PLLs included in a wafer based on the current values of the charging/discharging currents of the charge pumps in the PLLs extracted as samples from the wafer. If an integrated circuit including the charge pump with predetermined accuracy or more is selected, the yield is increased as compared to the above case of adjusting the charging/discharging currents of the charge pump in the PLLs with the use of samples from a wafer.

The optical disc apparatus control circuit 100 of this embodiment may be configured with the microcomputer 10 and the optical-disc LSI 11 and the CPU 20 set the set value in the setting register 50 to match the current values of the charging current and the discharging current of the charge pump 66 (S200 to S208).

Even if the charging current of the PLL 33 is adjusted before starting the reproduction of the optical disc 120, the charging current and the discharging current of the charge pump 66 may lose a balance due to changes in temperature, etc., during the reproduction. If the PLL 33 has been locked, this may cause the charging voltage VA to be changed and the PLL 33 may be unlocked as a result. The balance of the charging current and the discharging current of the charge pump is adjusted in this embodiment by referring to a change in the frequency of the clock signal CLK through the counter value of the counter 39 (S305). Therefore, since the charging current and the discharging current of the charge pump may be matched during the reproduction of the optical disc 120, the PLL 33 may be maintained in the locked state if temperature, etc., are changed.

If the error correction circuit 35 outputs the error detection signal indicative of the detection of the C1 error during the reproduction (S304: YES), the CPU 20 of this embodiment refers to a change in the frequency of the clock signal CLK through the counter value (S305). Therefore, since the frequency of the clock signal CLK is not necessary to be changed if the error detection signal is not output, the power consumption of the optical-disc LSI 11 may be reduced by stopping the operation of the counter 39, for example.

If the H-level defect signal DEF is output from the defect detection circuit 31 during the reproduction (S303: H), since the level of the detection signal DET from the optical pickup 110 is reduced and the output signal SL from the data slicer 32 is correspondingly reduced, the PLL 33 is unlocked. If the PLL 33 is unlocked, the charging voltage VA of the capacitor 160 may be reduced due to the effects of stopping the output of the charge pump 66 (S308), etc. If the defect signal DEF is changed from high to low, the charging current of the charge pump is increased greater than the charging current before the defect signal DEF was changed from low to high (S311), and is then returned to the charging current before the defect signal DEF was changed from low to high (S313) in this embodiment. Therefore, if the defect signal DEF is changed from high to low, the PLL 33 may be locked at an earlier time point.

If the defect signal DEF is changed from high to low, the charging current of the charge pump is increased greater than the charging current before the defect signal DEF was changed from low to high (S311), and is then returned to the charging current before the defect signal DEF was changed from low to high (S313) at the timing of outputting the frame synchronization signal from the EFM demodulation circuit 34 (S312) in this embodiment. Since the charging current adjusted before the defect signal DEF goes high is used after the PLL 33 is locked, the locked state of the PLL 33 may be maintained.

The embodiment may provide a phase synchronization circuit capable of accurately matching the current values of the charging current and the discharging current of the charge pump of the phase synchronization circuit as above.

The above embodiments of the present invention are simply for facilitating the understanding of the present invention and are not in any way to be construed as limiting the present invention. The present invention may variously be changed or altered without departing from its spirit and encompass equivalents thereof.

Although the charge pump 66 of the embodiment is configured to control the gate voltage of the PMOS transistor 70 with the control signal CONT, this is not a limitation. For example, a voltage of the back gate of the PMOS transistor 71 may be controlled without using the PMOS transistor 70. The PMOS transistor 70 may be a resistor with a predetermined resistance value and the resistor 73 may be replaced with an NMOS transistor to control the gate voltage of the replacing NMOS transistor with the control signal CONT.

Figure 3:
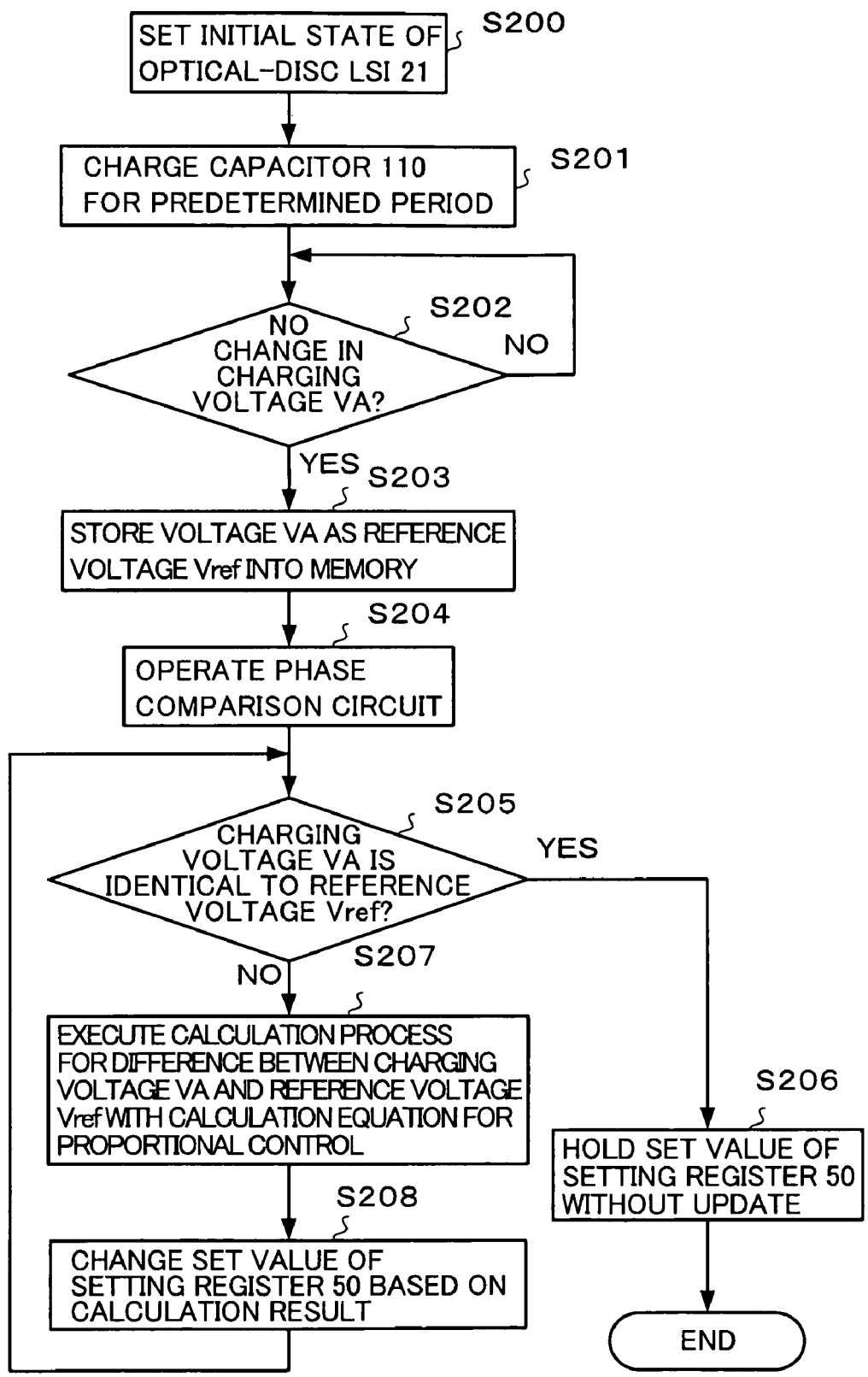
FIG. 3 is a flowchart of a process executed before starting reproduction of an optical disc 120.

Although the process of comparing the charging voltage VA and the reference voltage Vref is executed (S205) after the phase comparison circuit 64 is operated as shown in the flowchart of FIG. 3 (S204) in this embodiment, a change in the charging voltage VA may be checked as in the process at S202 without comparing the charging voltage VA with the reference voltage Vref. Specifically, after the CPU 20 activates the phase comparison circuit 64, the CPU 20 sequentially captures the charging voltage VA and stores the captured charging voltage VA at predetermined intervals. A difference is obtained between the latest charging voltage VA and the charging voltage VA stored immediately before the latest charging voltage VA. If the difference is positive, since the charging current of the charge pump 66 is greater than the discharging current, the CPU 20 raises the control signal CONT. On the other hand, if the difference is negative, since the charging current of the charge pump 66 is smaller than the discharging current, the CPU 20 lowers the control signal CONT. If the absolute value of the difference becomes less than a predetermined value, the set value of the setting register 50 may be held without update (S206) to terminate the process.

Although the pseudo EFM signal is concurrently output from the selector at S204 of FIG. 2 in this embodiment, this is not a limitation. For example, the control signal S4 may be turned to low and the switching control may be performed based on the control signals S5 and S6 such that the PMOS transistor 71 and the NMOS transistor 72 are turned on/off for the same periods. In this case, the resistance value of the PMOS transistor 70 may be matched with the resistance value 73 as in this embodiment.

Although the counter 39 changes the count value in synchronization with the clock signal CLK in this embodiment, the count value may be changed based on the frame synchronization signal since the frame synchronization signal is also generated at a predetermined frequency, for example.

Figure 4:
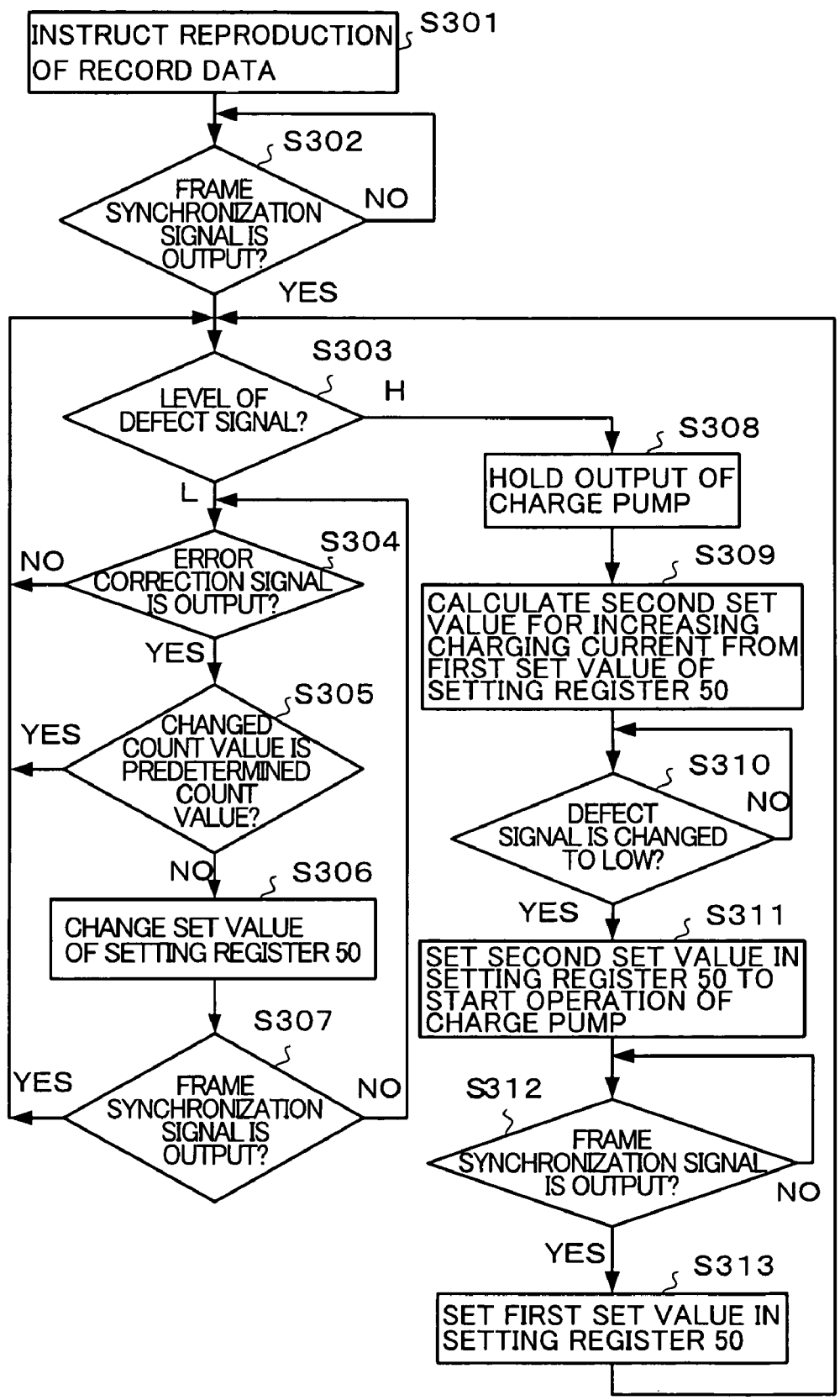
FIG. 4 is a flowchart of a process executed while the optical disc 120 is reproduced.
Figure 5:
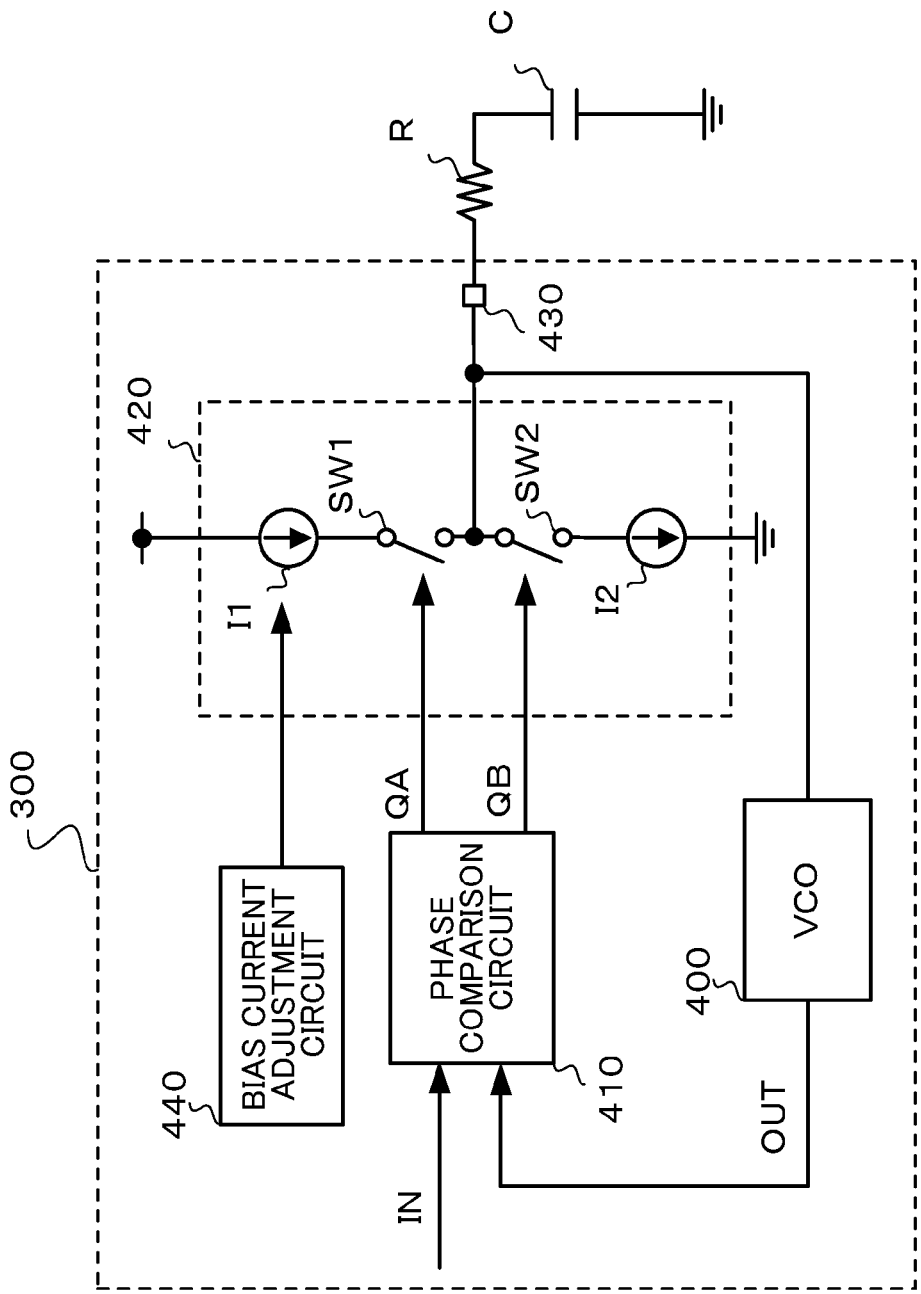
FIG. 5 is a diagram of a configuration of a typical PLL.
Figure 6:
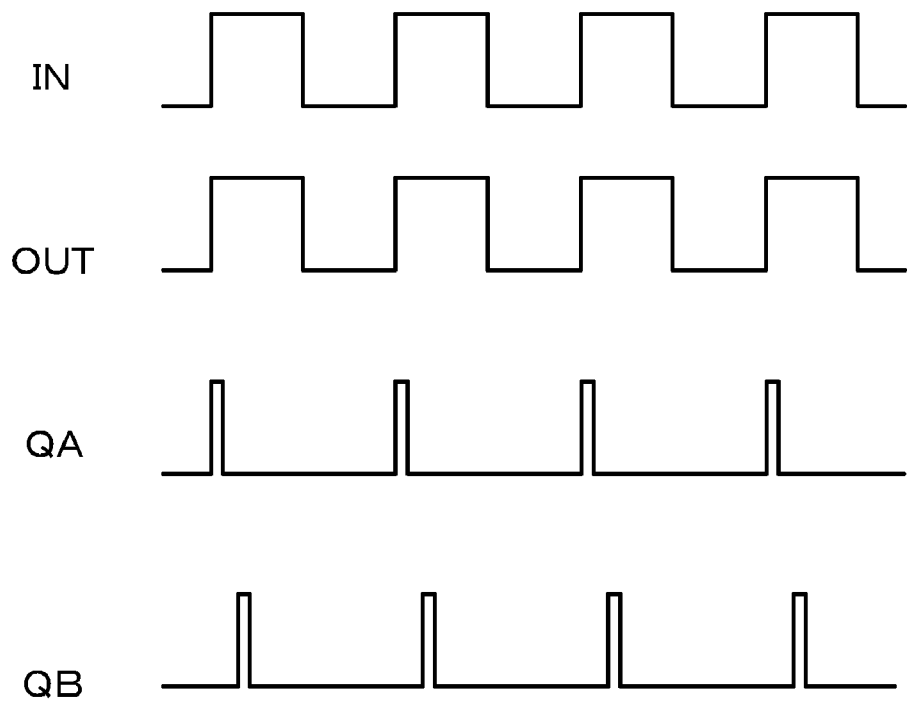
FIG. 6 is a diagram for explaining operation of the typical PLL.

Although the CPU 20 sets the first set value in the setting register 50 based on the frame synchronization signal output by the EFM demodulation circuit 34 (S312) in the flowchart of FIG. 4 in this embodiment, for example, the EFM demodulation circuit 34 may output a sub-code signal included in a frame instead of the frame synchronization signal and the process may be executed based on the sub-code signal. In such a case, at S312, for example, the process of S312 is repeated until the sub-code signal is output (S312: YES).

What is claimed is:

1. A phase synchronization circuit comprising:
a charging/discharging circuit configured to charge/discharge a capacitor in accordance with a drive signal giving an instruction to charge/discharge the capacitor, a current value of at least one of a charging current and a discharging current of the capacitor being settable;
an oscillation circuit configured to output an oscillation signal having a frequency corresponding to a charging voltage of the capacitor;
a drive circuit configured to output a first drive signal as the drive signal, the first drive signal being a signal for matching a charging period and a discharging period of the capacitor when a phase difference between an input signal as a reference of the oscillation signal and the oscillation signal is smaller than a predetermined phase difference and for reducing the phase difference when the phase difference is greater than the predetermined phase difference; and
a setting circuit configured to receive setting data for setting the current value of at least one of the charging current and the discharging current of the charging/discharging circuit, hold the setting data, and set the current value of at least one of the charging current and the discharging current of the charging/discharging circuit based on the setting data,
the drive circuit outputting as the drive signal a second drive signal for matching a charging period and a discharging period of the capacitor, when receiving an adjustment instruction signal giving an instruction to adjust a current value mismatch between the charging current and the discharging current of the charging/discharging circuit,
the setting circuit holding the setting data for rendering at a constant level the charging voltage of the capacitor charged/discharged in accordance with the second drive signal.

2. A phase synchronization circuit comprising:
a charging/discharging circuit configured to charge/discharge a capacitor in accordance with a drive signal giving an instruction to charge/discharge the capacitor, a current value of at least one of a charging current and a discharging current of the capacitor being settable;
an oscillation circuit configured to output an oscillation signal having a frequency corresponding to a charging voltage of the capacitor;
a drive circuit configured to output a first drive signal as the drive signal, the first drive signal being a signal for matching a charging period and a discharging period of the capacitor when a phase difference between an input signal as a reference of the oscillation signal and the oscillation signal is smaller than a predetermined phase difference and for reducing the phase difference when the phase difference is greater than the predetermined phase difference; and
a current control circuit configured to set the current value of at least one of the charging current and the discharging current of the charging/discharging circuit,
the drive circuit outputting as the drive signal a second drive signal for matching a charging period and a discharging period of the capacitor, when receiving an adjustment instruction signal giving an instruction to adjust a current value mismatch between the charging current and the discharging current of the charging/discharging circuit,
the current control circuit setting the current value of at least one of the charging current and the discharging current of the charging/discharging circuit so as to render at a constant level the charging voltage of the capacitor charged/discharged in accordance with the second drive signal.

3. The phase synchronization circuit of claim 2, further comprising
a synchronization signal output circuit configured to output a synchronization signal when a phase of the input signal is synchronized with a phase of the oscillation signal, wherein
after the synchronization signal is output, the current control circuit sets the current value of at least one of the charging current and the discharging current of the charging/discharging circuit so as to match: a frequency of the oscillation signal corresponding to the charging voltage of the capacitor charged/discharged in accordance with the first drive signal; to a frequency of the input signal, based on a relation in magnitude between the frequency of the input signal and the frequency of the oscillation signal.

4. The phase synchronization circuit of claim 3, further comprising
an error detection circuit configured to output an error detection signal when the input signal has an error, based on a signal for performing error detection included in the input signal, wherein
after the synchronization signal is output, the current control circuit sets the current value of at least one of the charging current and the discharging current of the charging/discharging circuit so as to match: the frequency of the oscillation signal corresponding to the charging voltage of the capacitor charged/discharged in accordance with the first drive signal; to the frequency of the input signal, when the error detection signal is output.

5. The phase synchronization circuit of claim 2, wherein
the input signal is a signal corresponding to an output signal from an optical pickup configured to read out record data recorded on an optical disc, wherein
the phase synchronization circuit further comprises a detection circuit configured to output a detection signal indicative of a relation in magnitude between a level of the output signal and a predetermined level, and wherein
the current control circuit includes
a holding circuit configured to hold a set value indicative of a current value of the charging current of the charging/discharging circuit, which current value is set before the level of the output signal becomes lower than the predetermined level, based on the detection signal of the detection circuit, and
a current setting circuit configured to
set the current value of the charging current of the charging/discharging circuit to be increased, and thereafter
set the current value of the charging current of the charging/discharging circuit at the current value set before the level of the output signal becomes lower than the predetermined level, based on the set value held in the holding circuit,
when the level of the output signal turns from lower to higher than the predetermined level,
at the time when the capacitor is charged/discharged in accordance with the first drive signal.

6. The phase synchronization circuit of claim 4, wherein
the input signal is a signal corresponding to an output signal from an optical pickup configured to read out record data recorded on an optical disc, wherein
the phase synchronization circuit further comprises a detection circuit configured to output a detection signal indicative of a relation in magnitude between a level of the output signal and a predetermined level, wherein
the error detection circuit outputs an error correction signal when error correction is possible, based on an error correction code included in the input signal, and wherein
the current control circuit includes
a holding circuit configured to hold a set value indicative of a current value of the charging current of the charging/discharging circuit, which current value is set before the level of the output signal becomes lower than the predetermined level, based on the detection signal of the detection circuit, and
a current setting circuit configured to
set the current value of the charging current of the charging/discharging circuit to be increased, and thereafter
set the current value of the charging current of the charging/discharging circuit at the current value set before the level of the output signal becomes lower than the predetermined level, based on the set value held in the holding circuit, when at least one of the synchronization signal and the error correction signal is output,
when the level of the output signal turns from lower to higher than the predetermined level,
at the time when the capacitor is charged/discharged in accordance with the first drive signal.

* * * * *